(12) United States Patent
Terasaki

(10) Patent No.: US 11,798,856 B2
(45) Date of Patent: Oct. 24, 2023

(54) CERAMIC/ALUMINUM BONDED BODY, INSULATING SUBSTRATE, LED MODULE, CERAMIC MEMBER, METHOD FOR PRODUCING CERAMIC/ALUMINUM BONDED BODY, AND METHOD FOR PRODUCING INSULATING SUBSTRATE

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 837 days.

(21) Appl. No.: 16/482,018

(22) PCT Filed: Feb. 6, 2018

(86) PCT No.: PCT/JP2018/003957
§ 371 (c)(1),
(2) Date: Jul. 30, 2019

(87) PCT Pub. No.: WO2018/143470
PCT Pub. Date: Aug. 9, 2018

(65) Prior Publication Data
US 2020/0006168 A1    Jan. 2, 2020

(30) Foreign Application Priority Data

Feb. 6, 2017  (JP) .................................. 2017-019737
Jan. 24, 2018  (JP) .................................. 2018-009821

(51) Int. Cl.
*H01L 23/15*    (2006.01)
*B23K 1/00*    (2006.01)
(Continued)

(52) U.S. Cl.
CPC ................ *H01L 23/15* (2013.01); *B23K 1/00* (2013.01); *C04B 37/025* (2013.01); *H01L 23/142* (2013.01); *H01L 33/64* (2013.01)

(58) Field of Classification Search
CPC .............................. H01L 23/15; H01L 23/142
See application file for complete search history.

(56) References Cited

U.S. PATENT DOCUMENTS 4,613,549 A    9/1986 Tanaka
6,040,039 A *  3/2000 Ikeda .................. H01L 23/3735
                                                    428/210
(Continued)

FOREIGN PATENT DOCUMENTS

CN    103503581 A    1/2014
CN    103515509 A    1/2014
(Continued)

OTHER PUBLICATIONS

M. Oliveira et al., "The influence of Y2O3-containing sintering additives on the oxidation of Si3N4-based ceramics and the interfacial interactions with liquid Al-alloys", Journal of The European Ceramic Society, Elsevier Science Publishers, Barking, Essex, GB, vol. 25, No. 1, Jan. 1, 2005, pp. 19-28. (cited in the Oct. 30, 2020 Search Report issued for EP 18747966.2).

(Continued)

*Primary Examiner* — Eugene Lee
(74) *Attorney, Agent, or Firm* — Locke Lord LLP; James E. Armstrong, IV; Nicholas J. DiCeglie, Jr.

(57) ABSTRACT

In a ceramic/aluminum bonded body according to the present invention, a ceramic member and an aluminum member formed of aluminum or an aluminum alloy are bonded to each other, the ceramic member has a ceramic main body formed of silicon nitride, and an aluminum nitride layer or an aluminum oxide layer formed on the surface of the ceramic main body to which the aluminum member is
(Continued)

bonded, the ceramic member and the aluminum member are bonded to each other through the aluminum nitride layer or the aluminum oxide layer, the ceramic main body is provided with silicon nitride phases and a glass phase formed between the silicon nitride phases, Al is present in a portion of the glass phase of the ceramic main body at an interface with the aluminum nitride layer or aluminum oxide layer.

20 Claims, 8 Drawing Sheets

(51) Int. Cl.
    *C04B 37/02*     (2006.01)
    *H01L 23/14*     (2006.01)
    *H01L 33/64*     (2010.01)

(56) References Cited

U.S. PATENT DOCUMENTS

| | | | |
|---|---|---|---|
| 6,086,990 | A | 7/2000 | Sumino et al. |
| 6,107,638 | A | 8/2000 | Sumino et al. |
| 6,426,154 | B1 | 7/2002 | Naba et al. |
| 2002/0084103 | A1* | 7/2002 | Komatsu ............... H01L 23/15 257/E23.009 |
| 2009/0039477 | A1* | 2/2009 | Kaga ..................... H05K 1/0306 257/E29.109 |
| 2011/0176277 | A1* | 7/2011 | Kaga ..................... H05K 1/0306 264/650 |
| 2012/0114966 | A1 | 5/2012 | Tuan et al. |
| 2012/0281362 | A1* | 11/2012 | Ishimine ................. H01L 35/32 428/149 |
| 2014/0220302 | A1* | 8/2014 | Kaga ....................... C04B 35/64 428/149 |
| 2015/0255419 | A1* | 9/2015 | Nishimoto ............. C04B 37/026 257/773 |
| 2017/0256483 | A1* | 9/2017 | Matsuyama ............ H01L 24/49 |
| 2018/0002237 | A1* | 1/2018 | Aoki ...................... C04B 35/584 |
| 2018/0005918 | A1 | 1/2018 | Naba et al. |

FOREIGN PATENT DOCUMENTS

| | | |
|---|---|---|
| CN | 105027277 A | 11/2015 |
| EP | 2484957 A1 | 8/2012 |
| EP | 2811513 A1 | 12/2014 |
| EP | 3382752 A1 | 10/2018 |
| JP | 09-153567 A | 6/1997 |
| JP | 11-154719 A | 6/1999 |
| JP | 3171234 B2 | 5/2001 |
| JP | 2002-171037 A | 6/2002 |
| JP | 2008-047604 A | 2/2008 |
| JP | 2008-063187 A | 3/2008 |
| JP | 2010-010563 A | 1/2010 |
| JP | 2013-153157 A | 8/2013 |
| JP | 2015-070199 A | 4/2015 |
| WO | 2011/004798 A1 | 1/2011 |
| WO | 2018/021472 A1 | 2/2018 |

OTHER PUBLICATIONS

Supplementary European Search Report dated Oct. 30, 2020, issued for European patent application No. 18747966.2.
International Search Report dated Mar. 13, 2018, issued for PCT/JP2018/003957.
Office Action dated Jun. 15, 2021, issued for Chinese Patent Application No. 201880007306.6 and an English translation of Search Report.
Notice of Allowance issued in corresponding Japanese Patent Application No. JP 2021-178764, dated Feb. 7, 2023.
Notice of Allowance issued in corresponding Japanese Patent Application No. JP 2021-17874, dated Feb. 7, 2023.
Communication (Office Action) issued in corresponding European Patent Application No. EP 18747966.2, dated May 10, 2023.

* cited by examiner

CERAMIC/ALUMINUM BONDED BODY, INSULATING SUBSTRATE, LED MODULE, CERAMIC MEMBER, METHOD FOR PRODUCING CERAMIC/ALUMINUM BONDED BODY, AND METHOD FOR PRODUCING INSULATING SUBSTRATE

TECHNICAL FIELD

The present invention relates to a ceramic/aluminum bonded body obtained by bonding a ceramic member and an aluminum member formed of aluminum or an aluminum alloy, an insulating substrate obtained by bonding a ceramic substrate and an aluminum plate formed of aluminum or an aluminum alloy, an LED module including the insulating substrate, a ceramic member used in the above-described ceramic/aluminum bonded body, a method for producing the above-described ceramic/aluminum bonded body, and a method for producing an insulating substrate.

Priority is claimed on Japanese Patent Application No. 2017-019737, filed on Feb. 6, 2017, and Japanese Patent Application No. 2018-009821 filed on Jan. 24, 2018, the contents of which are incorporated herein by reference.

BACKGROUND ART

A power module, an LED module, and a thermoelectric module have a structure in which a power semiconductor element, an LED element, and a thermoelectric element are bonded to an insulating substrate in which a circuit layer formed of a conductive material is formed on one surface of an insulating layer.

In addition, in the above-described insulating substrate, a structure in which a metal plate having excellent conductivity is bonded to one surface of a ceramic substrate to form a circuit layer and a metal plate having excellent heat dissipation is bonded to the other surface of the ceramic substrate to form a metal layer is provided.

Further, in order to efficiently dissipate heat generated from an element mounted on the circuit layer or the like, an insulating substrate with a heat sink in which the heat sink is bonded to a metal layer side of the insulating substrate is also provided.

For example, a power module disclosed in PTL 1 has a structure including an insulating substrate in which a circuit layer formed of an aluminum plate is formed on one surface of a ceramic substrate and a metal layer formed of an aluminum plate is formed on the other surface thereof; and a semiconductor element which is bonded to the circuit layer through a solder material.

In addition, LED modules disclosed in PTLs 2 and 3 have a structure in which a conductive circuit layer is formed on one surface of a substrate formed of ceramic, a heat dissipating body is bonded to the other surface of the insulating substrate, and a light emitting element is mounted on the circuit layer is provided.

Here, an Al—Si-based brazing filler material is usually used in the case where a ceramic substrate and an aluminum plate, which becomes a circuit layer or a metal layer, are bonded to each other.

CITATION LIST

Patent Literature

[PTL 1] Japanese Patent No. 3171234
[PTL 2] Japanese Unexamined Patent Application, First Publication No. 2013-153157
[PTL 3] Japanese Unexamined Patent Application, First Publication No. 2015-070199

SUMMARY OF INVENTION

Technical Problem

However, in the above-described LED module or the like, it is required to further reduce the thickness of a circuit layer on which a light emitting element is mounted, and for example, an aluminum plate having a thickness of 100 μm or less is bonded to a ceramic substrate in some cases.

In the case where such a thin aluminum plate is bonded to a ceramic substrate using an Al—Si-based brazing filler material, Si of the brazing filler material is diffused into the aluminum plate, which becomes a circuit layer, to lower the melting point. Thus, there is a concern that part of the circuit layer may be melted.

In the case where the bonding temperature is lowered or the amount of Si in the brazing filler material is reduced to suppress melting of the circuit layer, bonding is not sufficient and bonding reliability is deteriorated. Therefore, this module cannot be applied to applications with high heat generation density.

As described above, in an insulating substrate in the related art, in the case where a thin circuit layer is formed, it is difficult to suppress melting of the circuit layer and to improve bonding reliability between the circuit layer and the ceramic substrate.

In addition, in order to secure the strength in an LED module, a ceramic substrate formed of silicon nitride ($Si_3N_4$) may be used. However, the ceramic substrate formed of silicon nitride ($Si_3N_4$) is provided with silicon nitride phases and a glass phase formed between the silicon nitride phases, this glass phase and the aluminum plate are not sufficiently bonded to each other, and thus it is not possible to obtain sufficient bonding strength. The glass phase is formed by a sintering aid added during the sintering of the raw material of silicon nitride.

From the above, in the ceramic substrate formed of silicon nitride ($Si_3N_4$), compared to a ceramic substrate formed of aluminum nitride (AlN) or aluminum oxide ($Al_2O_3$), the bonding reliability between the ceramic substrate and the metal plate (particularly, aluminum plate) is deteriorated.

The present invention has been made in view of the above-described circumstances, and an object thereof is to provide a ceramic/aluminum bonded body in which an aluminum member is bonded to a ceramic member formed of silicon nitride ($Si_3N_4$) with high reliability without melting, an insulating substrate, an LED module including the insulating substrate, a ceramic member used in the above-described ceramic/aluminum bonded body, a method for producing a ceramic/aluminum bonded body, and a method for producing an insulating substrate.

Solution to Problem

In order to solve the problems, a ceramic/aluminum bonded body according to an aspect of the present invention is a ceramic/aluminum bonded body including a ceramic member; and an aluminum member formed of aluminum or an aluminum alloy, in which the ceramic member and the aluminum member are bonded to each other, the ceramic member has a ceramic main body formed of silicon nitride, and an aluminum nitride layer or an aluminum oxide layer formed on a surface of the ceramic main body to which the aluminum member is bonded, the aluminum member is bonded to the ceramic member through the aluminum nitride layer or the aluminum oxide layer, the ceramic main body is provided with silicon nitride phases and a glass phase formed between the silicon nitride phases, and Al is present in a portion of the glass phase of the ceramic main body at an interface with the aluminum nitride layer or the aluminum oxide layer.

According to the ceramic/aluminum bonded body having the configuration, since the ceramic member has the ceramic main body formed of silicon nitride, and the aluminum nitride layer or the aluminum oxide layer formed on the surface of the ceramic main body to which the aluminum member is bonded, and Al is present in the portion of the glass phase of the ceramic main body at the interface with the aluminum nitride layer or the aluminum oxide layer, the ceramic main body formed of silicon nitride and the aluminum nitride layer or the aluminum oxide layer are firmly bonded to each other.

In addition, since the aluminum nitride layer or the aluminum oxide layer of the ceramic member and the aluminum member are bonded to each other, the bonding reliability between the aluminum member and the ceramic member is high.

Thus, it is possible to provide a ceramic/aluminum bonded body having excellent bonding reliability.

Here, in the ceramic/aluminum bonded body according to the aspect of the present invention, the aluminum nitride layer may be formed on the surface of the ceramic main body to which the aluminum member is bonded, and the aluminum nitride layer may have a first aluminum nitride layer having a nitrogen concentration of 50 atom % or more and 80 atom % or less and having a nitrogen concentration gradient in a thickness direction, and a second aluminum nitride layer having a nitrogen concentration of 30 atom % or more and less than 50 atom % in order from the ceramic main body.

In this case, since the aluminum nitride layer has the first aluminum nitride layer having a nitrogen concentration of 50 atom % or more and 80 atom % or less and having a nitrogen concentration gradient in the thickness direction, and the second aluminum nitride layer having a nitrogen concentration of 30 atom % or more and less than 50 atom % in order from the ceramic main body as described above, the aluminum nitride layer is formed by a reaction of the silicon nitride of the ceramic main body and the ceramic main body formed of silicon nitride and the aluminum nitride layer are more firmly bonded to each other. Thus, even in the case where a thermal cycle is loaded on the ceramic/aluminum bonded body, the bonding ratio between the ceramic member and the aluminum member can be prevented from being decreased.

An insulating substrate according to another aspect of the present invention is an insulating substrate including: a ceramic substrate; and an aluminum plate formed of aluminum or an aluminum alloy, in which the ceramic substrate and the aluminum plate are bonded to each other, the ceramic substrate has a ceramic main body formed of silicon nitride and an aluminum nitride layer or an aluminum oxide layer formed on a surface of the ceramic main body to which the aluminum plate is bonded, the aluminum plate is bonded to the ceramic substrate through the aluminum nitride layer or the aluminum oxide layer, the ceramic main body is provided with silicon nitride phases and a glass phase formed between the silicon nitride phases, and Al is present in a portion of the glass phase of the ceramic main body at an interface with the aluminum nitride layer or the aluminum oxide layer.

According to the insulating substrate having the configuration, since the ceramic substrate has the ceramic main body formed of silicon nitride, and the aluminum nitride layer or the aluminum oxide layer, and Al is present in the portion of the glass phase of the ceramic main body at the interface with the aluminum nitride layer or the aluminum oxide layer, the ceramic main body formed of silicon nitride and the aluminum nitride layer or the aluminum oxide layer are firmly bonded to each other.

In addition, since the aluminum nitride layer or the aluminum oxide layer of the ceramic substrate and the aluminum plate are bonded to each other, it is possible to provide an insulating substrate having excellent bonding reliability between the aluminum plate and the ceramic substrate.

Here, in the insulating substrate according to the aspect of the present invention, the aluminum nitride layer may be formed on the surface of the ceramic main body to which the aluminum plate is bonded, and the aluminum nitride layer may have a first aluminum nitride layer having a nitrogen concentration of 50 atom % or more and 80 atom % or less and having a nitrogen concentration gradient in a thickness direction, and a second aluminum nitride layer having a nitrogen concentration of 30 atom % or more and less than 50 atom % in order from the ceramic main body.

In this case, since the aluminum nitride layer has the first aluminum nitride layer having a nitrogen concentration of 50 atom % or more and 80 atom % or less and having a nitrogen concentration gradient in the thickness direction, and the second aluminum nitride layer having a nitrogen concentration of 30 atom % or more and less than 50 atom % as described above, the aluminum nitride layer is formed by a reaction of the silicon nitride of the ceramic main body and the ceramic main body formed of silicon nitride and the aluminum nitride layer are more firmly bonded to each other. Thus, even in the case where a thermal cycle is loaded on the insulating substrate, the bonding ratio between the ceramic substrate and the aluminum plate can be prevented from being decreased.

An LED module according to still another aspect of the present invention includes the above-described insulating substrate; and an LED element bonded to one surface of the aluminum plate.

In the LED module having the configuration, since the insulating substrate having excellent bonding reliability between the ceramic substrate and the aluminum plate is used, even in the case where a thermal cycle is loaded, defects such as peeling can be prevented from occurring.

A ceramic member according to still another aspect of the present invention includes a ceramic main body formed of silicon nitride, and an aluminum nitride layer or an aluminum oxide layer formed on a surface of the ceramic main body, in which the ceramic main body is provided with silicon nitride phases and a glass phase formed between the silicon nitride phases, and Al is present in a portion of the glass phase of the ceramic main body at an interface with the aluminum nitride layer or the aluminum oxide layer.

According to the ceramic member having the configuration, since Al is present in the portion of the glass phase of the ceramic main body at the interface with the aluminum nitride layer or the aluminum oxide layer, the ceramic main body formed of silicon nitride and the aluminum nitride layer or the aluminum oxide layer are firmly bonded to each other.

In addition, since the aluminum nitride layer or the aluminum oxide layer is provided, the ceramic member and the aluminum member can be satisfactorily bonded to each other.

Here, in the ceramic member according to the aspect of the present invention, the aluminum nitride layer may be formed on a surface of the ceramic main body, and the aluminum nitride layer may have a first aluminum nitride layer having a nitrogen concentration of 50 atom % or more and 80 atom % or less and having a nitrogen concentration gradient in a thickness direction, and a second aluminum nitride layer having a nitrogen concentration of 30 atom % or more and less than 50 atom % in order from the ceramic main body.

In this case, since the aluminum nitride layer has the first aluminum nitride layer having a nitrogen concentration of 50 atom % or more and 80 atom % or less and having a nitrogen concentration gradient in the thickness direction, and the second aluminum nitride layer having a nitrogen concentration of 30 atom % or more and less than 50 atom % as described above, the aluminum nitride layer is formed by a reaction of the silicon nitride of the ceramic main body and the ceramic main body formed of silicon nitride and the aluminum nitride layer are more firmly bonded to each other.

In the ceramic member according to the aspect of the present invention, the aluminum nitride layer may be formed on a surface of the ceramic main body, and a metal aluminum portion may be formed on a surface of the aluminum nitride layer opposite to the ceramic main body.

In this case, the aluminum member can be bonded to the ceramic member through the metal aluminum portion, and the aluminum member can be more easily bonded to the ceramic member. The metal aluminum portion is not necessarily formed over the entire surface of the aluminum nitride layer opposite to the ceramic main body may be partially formed on the surface of the aluminum nitride layer.

A method for producing a ceramic/aluminum bonded body according to still another aspect of the present invention is a method for producing a ceramic/aluminum bonded body to produce the above-described ceramic/aluminum bonded body and the method includes: an aluminum layer forming step of forming an aluminum layer having a thickness of 20 μm or less on a surface of a ceramic main body formed of silicon nitride; an aluminum nitride layer forming step of heating the ceramic main body on which the aluminum layer is formed to a temperature equal to or higher than a solidus temperature of the aluminum layer to form an aluminum nitride layer; and an aluminum member bonding step of bonding an aluminum member to the ceramic main body through the aluminum nitride layer.

According to the method for producing a ceramic/aluminum bonded body having the configuration, the aluminum layer forming step of forming the aluminum layer having a thickness of 20 μm or less on the surface of the ceramic main body formed of silicon nitride, and the aluminum nitride layer forming step of heating the ceramic main body on which the aluminum layer is formed to the temperature equal to or higher than the solidus temperature of the aluminum layer to form the aluminum nitride layer are provided. Therefore, in the aluminum nitride layer forming step, Al penetrates into the glass phase of the ceramic main body and nitrogen produced by decomposition of $Si_3N_4$ of the silicon nitride phase is caused to react with the aluminum layer to form the aluminum nitride layer. Since part of the aluminum layer remains, a metal aluminum portion is formed on the surface of the aluminum nitride layer opposite to the ceramic main body.

Since the method includes the aluminum member bonding step of bonding the aluminum member to the ceramic main body through the aluminum nitride layer, the ceramic member and the aluminum member can be easily bonded to each other.

Thus, it is possible to produce a ceramic/aluminum bonded body having excellent bonding reliability.

The method for producing a ceramic/aluminum bonded body according to the aspect of the present invention may further include: an oxidation treatment step of oxidizing the aluminum nitride layer to form an aluminum oxide layer; and an aluminum member bonding step of bonding an aluminum member to the ceramic main body through the aluminum oxide layer.

In this case, the aluminum oxide layer can be formed by oxidizing the aluminum nitride layer. In the case where a metal aluminum portion is formed on the surface of the aluminum nitride layer opposite to the ceramic main body, the metal aluminum portion also becomes the aluminum oxide layer by the oxidation treatment step.

In addition, since the aluminum member bonding step of bonding the aluminum member to the ceramic member through the aluminum oxide layer is provided, the ceramic member and the aluminum member can be easily bonded to each other.

Thus, it is possible to produce a ceramic/aluminum bonded body having excellent bonding reliability.

A method for producing an insulating substrate according to still another aspect of the present invention is a method for producing an insulating substrate to produce the above-described insulating substrate and the method includes: an aluminum layer forming step of forming an aluminum layer having a thickness of 20 μm or less on a surface of a ceramic main body formed of silicon nitride; an aluminum nitride layer forming step of heating the ceramic main body on which the aluminum layer is formed to a temperature equal to or higher than a solidus temperature of the aluminum layer to form an aluminum nitride layer; and an aluminum plate bonding step of bonding an aluminum plate to the ceramic main body through the aluminum nitride layer.

According to the method for producing an insulating substrate having the configuration, the aluminum layer forming step of forming the aluminum layer having a thickness of 20 μm or less on the surface of the ceramic main body formed of silicon nitride silicon nitride, and the aluminum nitride layer forming step of heating the ceramic main body on which the aluminum layer is formed to the temperature equal to or higher than the solidus temperature of the aluminum layer to form the aluminum nitride layer are provided. Therefore, in the aluminum nitride layer forming step, Al penetrates into the glass phase of the ceramic main body and nitrogen produced by decomposition of $Si_3N_4$ of the silicon nitride phase is caused to react with the aluminum layer to form the aluminum nitride layer. Since part of the aluminum layer remains, a metal aluminum portion is formed on the surface of the aluminum nitride layer opposite to the ceramic main body.

Since the aluminum plate bonding step of bonding the aluminum plate to the ceramic main body through the aluminum nitride layer is provided, the ceramic substrate and the aluminum plate can be easily bonded to each other.

Thus, it is possible to produce an insulating substrate having excellent bonding reliability.

The method for producing an insulating substrate according to the aspect of the present invention may further include: an oxidation treatment step of oxidizing the aluminum nitride layer to form an aluminum oxide layer; and an aluminum plate bonding step of bonding an aluminum plate to the ceramic main body through the aluminum oxide layer.

In this case, the aluminum oxide layer can be formed by oxidizing the aluminum nitride layer. In the case where a metal aluminum portion is formed on the surface of the aluminum nitride layer opposite to the ceramic main body, the metal aluminum portion also becomes the aluminum oxide layer by the oxidation treatment step.

In addition, since the aluminum plate bonding step of bonding the aluminum plate to the ceramic member through the aluminum oxide layer is provided, the ceramic substrate and the aluminum plate can be easily bonded to each other.

Thus, it is possible to produce an insulating substrate having excellent bonding reliability.

Advantageous Effects of Invention

According to the present invention, it is possible to provide a ceramic/aluminum bonded body obtained by bonding an aluminum member and a ceramic member formed of silicon nitride ($Si_3N_4$) with high reliability without melting, an insulating substrate, an LED module including the insulating substrate, a ceramic member used in the above-described ceramic/aluminum bonded body, a method for producing a ceramic/aluminum bonded body, and a method for producing an insulating substrate.

DESCRIPTION OF EMBODIMENTS

Figure 1:
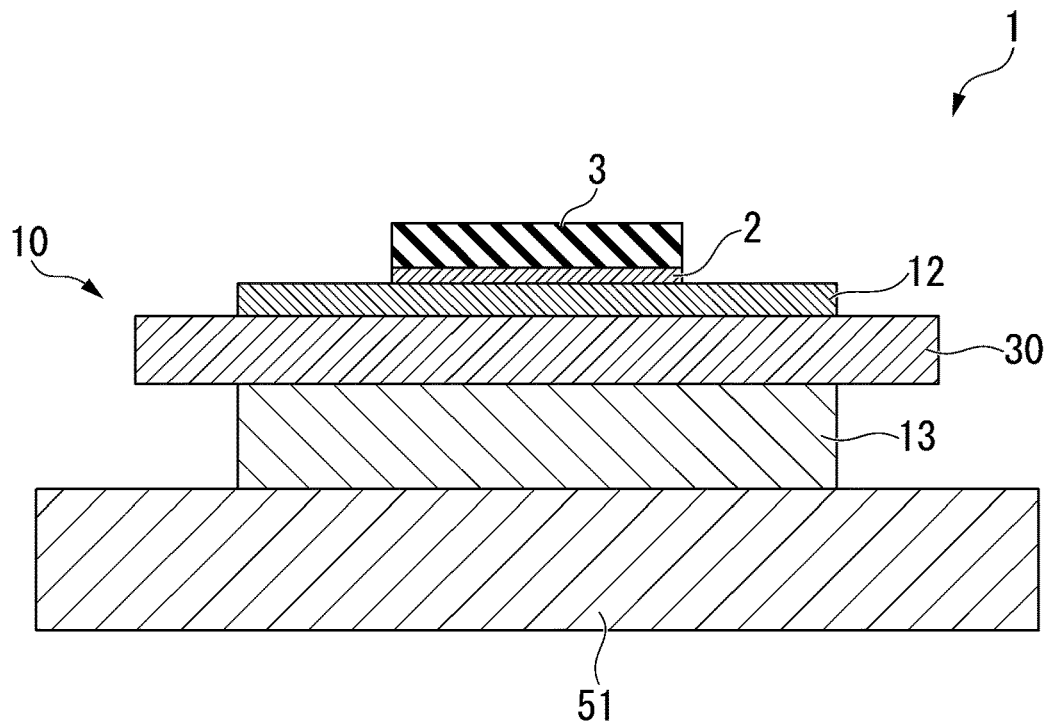
FIG. 1 is a cross-sectional view showing an LED module using a ceramic/aluminum bonded body (insulating substrate) which is a first embodiment of the present invention.

Hereinafter, embodiments of the present invention will be described with reference to the attached drawings.

First Embodiment

First, a first embodiment of the present invention will be described with reference to FIGS. 1 to 6.

A ceramic/aluminum bonded body according to an embodiment is an insulating substrate 10 formed by bonding a ceramic substrate 11 which is a ceramic member, and aluminum plates 22 and 23 (circuit layer 12, metal layer 13) which are aluminum members.

FIG. 1 shows the insulating substrate 10 (ceramic/aluminum bonded body) according to the first embodiment of the present invention and an LED module 1 using the insulating substrate 10.

The LED module 1 includes the insulating substrate 10, an LED element 3 bonded to one surface (upper side in FIG. 1) of the insulating substrate 10 through a bonding layer 2, and a heat sink 51 arranged on the other surface (lower side in FIG. 1) of the insulating substrate 10.

The LED element 3 is constituted of a semiconductor material and a photoelectric conversion element that converts electric energy into light. Since the light conversion efficiency of the LED element 3 is about 20% to 30%, and the remaining 70% to 80% of the energy is heat, the LED module 1 is required to efficiently dissipate heat.

Here, the bonding layer 2 for bonding the LED element 3 and the insulating substrate 10 is formed of, for example, an Au—Sn alloy solder material or the like.

As shown in FIG. 1, the insulating substrate 10 according to the embodiment includes a ceramic substrate 30, a circuit layer 12 arranged on one surface of the ceramic substrate 30 (upper surface in FIG. 1), and a metal layer 13 arranged on the other surface of the ceramic substrate 30 (lower surface in FIG. 1).

The ceramic substrate 30 is constituted of highly insulating silicon nitride ($Si_3N_4$). Here, the thickness of the ceramic substrate 30 is set to be in a range of 0.2 to 1.5 mm and is set to 0.32 mm in the embodiment.

Figure 4:
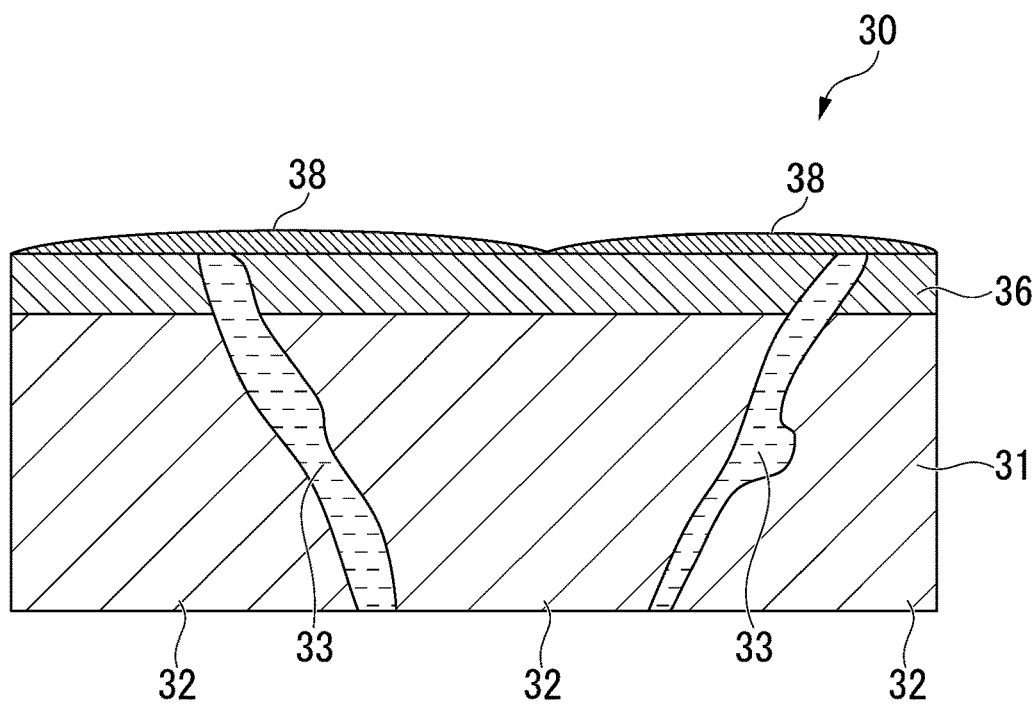
FIG. 4 is an enlarged explanatory diagram of the ceramic member (ceramic substrate) before bonding in the ceramic/aluminum bonded body (insulating substrate) which is the first embodiment of the present invention.

Here, as shown in FIG. 4, the ceramic substrate 30 in the embodiment has a ceramic main body 31 formed of silicon nitride, and an aluminum nitride layer 36 formed on the surface of the ceramic main body 31 to which the circuit layer 12 and the metal layer 13 is bonded.

Figure 6:
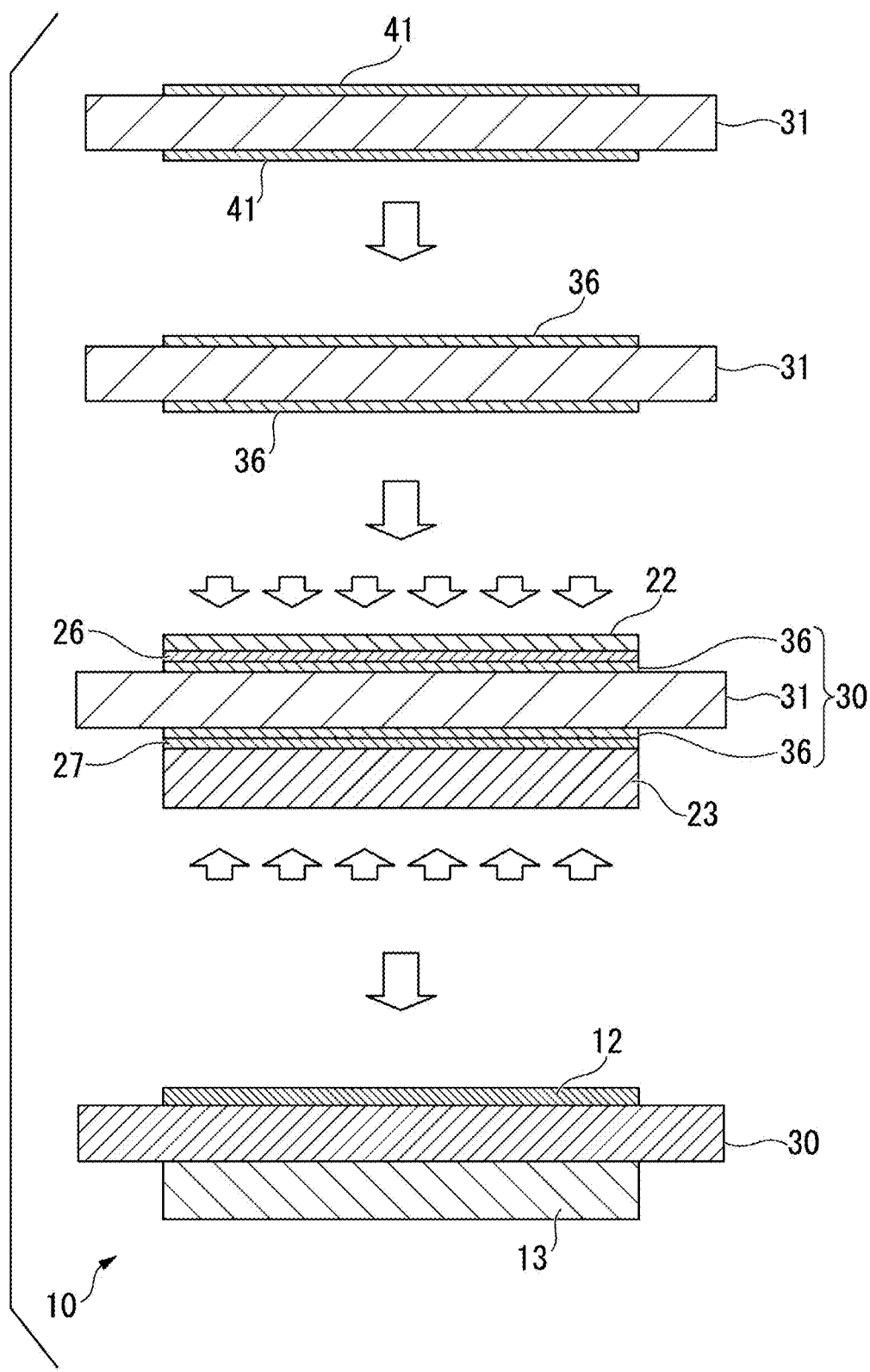
FIG. 6 is an explanatory diagram showing the method for producing the ceramic/aluminum bonded body (insulating substrate) which is the first embodiment of the present invention.

As shown in FIG. 6, the circuit layer 12 is formed by bonding the aluminum plate 22 (aluminum member) formed of aluminum or an aluminum alloy to one surface of the ceramic substrate 30 (upper surface in FIG. 6). As the aluminum plate 22 (aluminum member) constituting the circuit layer 12, for example, a rolled plate of aluminum (2N aluminum) having a purity of 99% by mass or higher, aluminum having a purity of 99.9% by mass or higher, or aluminum having a purity of 99.99% by mass or higher is preferably used, and in the embodiment, aluminum (2N aluminum) having a purity of 99% by mass or higher is used. The thickness of the circuit layer 12 is set to be in a range of, for example, 0.05 mm or more and 0.8 mm or less and is set to 0.2 mm in the embodiment.

As shown in FIG. 6, the metal 13 is formed by bonding the aluminum plate 23 (aluminum member) formed of aluminum or an aluminum alloy to the other surface of the ceramic substrate 30 (lower surface in FIG. 6). As the aluminum plate 23 (aluminum member) constituting the metal layer 13, for example, a rolled plate of aluminum (2N aluminum) having a purity of 99% by mass or higher, aluminum having a purity of 99.9% by mass or higher, or aluminum having a purity of 99.99% by mass or higher is preferably used, and in the embodiment, aluminum (2N aluminum) having a purity of 99% by mass or higher is used. The thickness of the metal layer 13 is set to be in a range of, for example, 0.05 mm or more and 1.6 mm or less and is set to 0.6 mm in the embodiment.

The heat sink 51 is provided for cooling the above-described insulating substrate 10 and in the embodiment, a heat dissipation plate constituted of a material having good thermal conductivity is used. In the embodiment, the heat sink 51 is constituted of A6063 (aluminum alloy).

In the embodiment, the heat sink 51 is directly bonded to the metal layer 13 of the insulating substrate 10 using a solder material.

Figure 2:
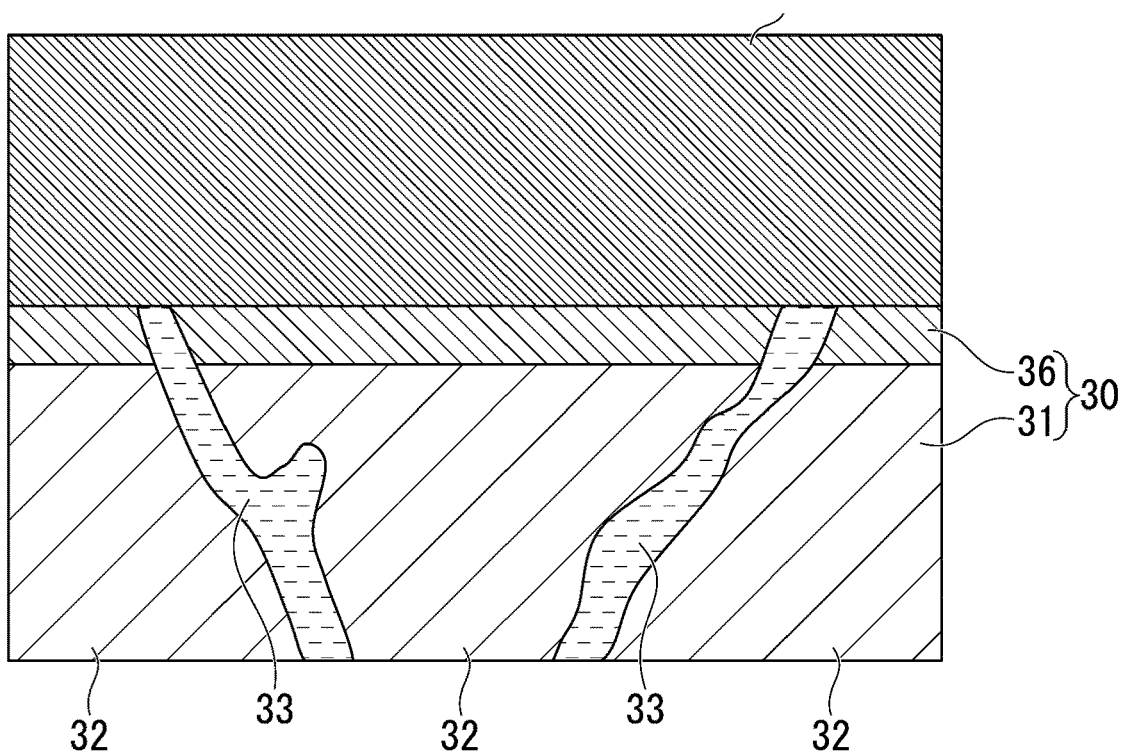
FIG. 2 is a schematic view of a bonding interface between a ceramic member (ceramic substrate) and an aluminum member (aluminum plate) of the ceramic/aluminum bonded body (insulating substrate) which is the first embodiment of the present invention.

Here, an enlarged explanatory diagram of the bonding interface between the ceramic substrate 30 and the circuit layer 12 and the metal layer 13 is shown in FIG. 2.

As described above, the ceramic substrate 30 has the ceramic main body 31 formed of silicon nitride, and the aluminum nitride layer 36 formed on the surface of the ceramic main body 31 to which the circuit layer 12 and the metal layer 13 is bonded, and has a structure in which the aluminum nitride layer 36 and the circuit layer 12 and the metal layer 13 are bonded to each other.

Here, the thickness of the aluminum nitride layer 36 is preferably set to be in a range of 4 nm or more and 100 nm or less.

Figure 3:
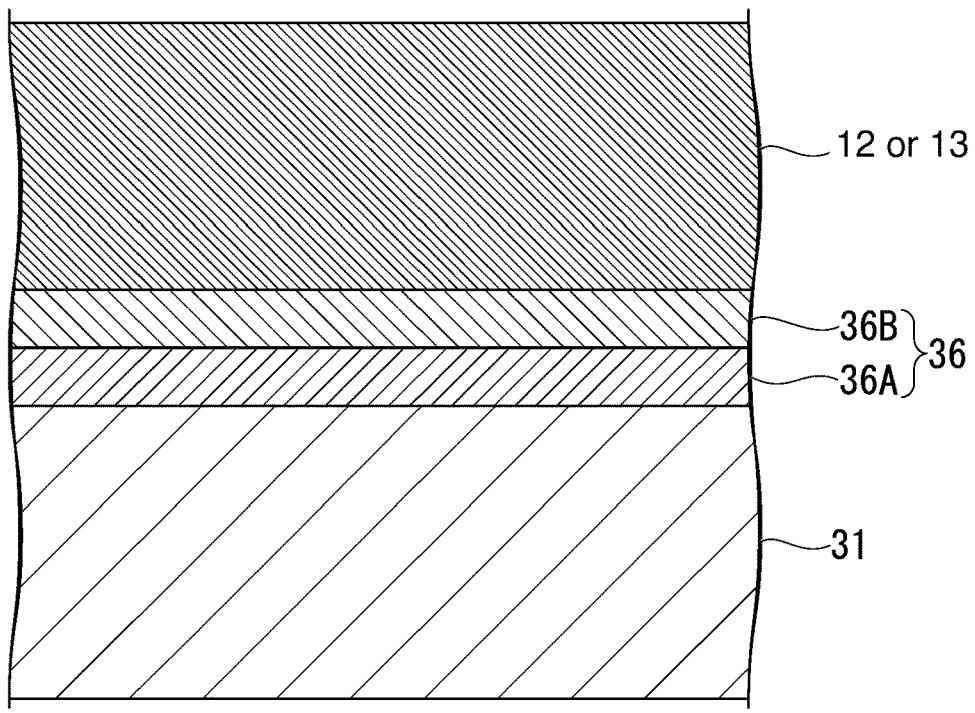
FIG. 3 is an enlarged explanatory diagram of an aluminum nitride layer in the ceramic/aluminum bonded body (insulating substrate) which is the first embodiment of the present invention.

In addition, in the embodiment, as shown in FIG. 3, the aluminum nitride layer 36 has a first aluminum nitride layer 36A having a nitrogen concentration of 50 atom % or more and 80 atom % or less and having a nitrogen concentration gradient in the thickness direction, and a second aluminum nitride layer 36B having a nitrogen concentration of 30 atom % or more and less than 50 atom % and having an almost constant nitrogen concentration in the thickness direction in order from the ceramic main body 31.

As shown in FIG. 2, the ceramic main body 31 is provided with a silicon nitride phase 32 and a glass phase 33, and Al is present in the glass phase 33. The glass phase 33 is formed by a sintering aid used during the sintering of the raw material of silicon nitride and is present at the grain boundary between the silicon nitride phases 32 as shown in FIG. 2.

Here, in the embodiment, at the time of analyzing the bonding interface, a region in which, when the total value of Al, Si, O, and N is 100 atom %, Si is less than 15 atom %, and O is in a range of 3 atom % or more and 25 atom % or less is set to the glass phase 33.

The amount of Al present in the glass phase 33 is preferably set to in a range of 35 atom % or more and 65 atom % or less when the total value of Al, Si, O, and N is 100 atom %.

Figure 5:
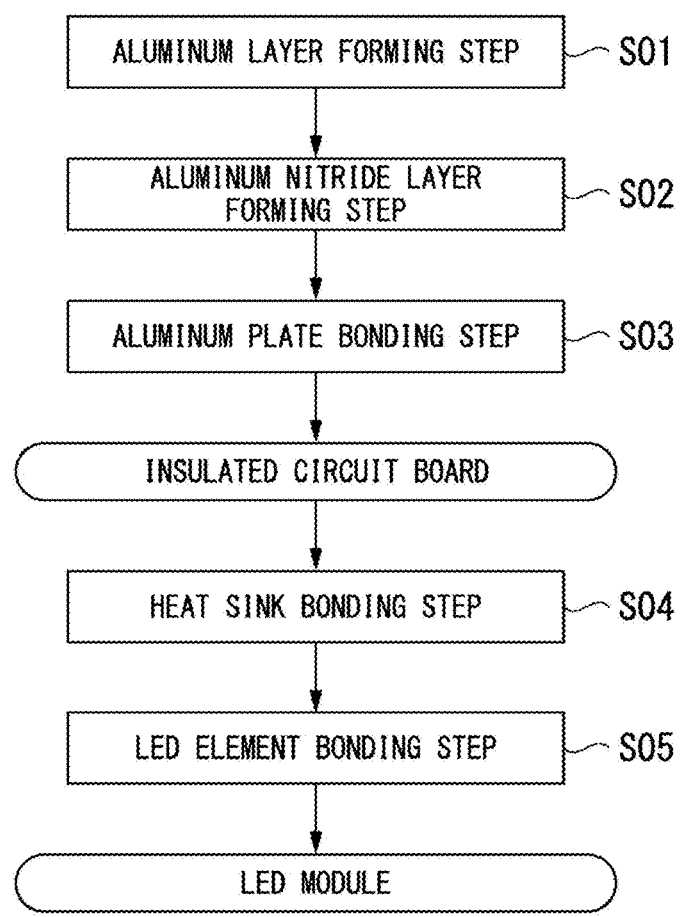
FIG. 5 is a flow chart showing a method for producing the ceramic/aluminum bonded body (insulating substrate) which is the first embodiment of the present invention.

Next, a method for producing the insulating substrate 10 which is the above-described embodiment will be described with reference to FIGS. 5 and 6.

(Aluminum Layer Forming Step S01)

A plate material (ceramic main body 31) formed of silicon nitride is prepared to form an aluminum layer 41 having a thickness of 20 μm or less and formed of aluminum or an aluminum alloy on the surface of the ceramic main body 31. In the embodiment, the aluminum layer 41 is constituted of pure aluminum having a purity of 99% by mass or higher.

Here, in the case where the aluminum layer 41 having a thickness of less than 1 μm, a film formation technique such as sputtering is preferably applied. In addition, in the case where the aluminum layer 41 having a thickness of 1 μm or more and 20 μm or less is formed, a rolled foil or the like is preferably laminated on the surface of the ceramic main body 31.

The lower limit of the thickness of the aluminum layer 41 is preferably 5 μm or more and the upper limit of the thickness of the aluminum layer 41 is 10 μm or less.

(Aluminum Nitride Layer Forming Step S02)

Next, the ceramic main body 31 on which the aluminum layer 41 is formed is subjected to a heat treatment at a temperature equal to or higher than the solidus temperature of aluminum or an aluminum alloy constituting the aluminum layer 41 to form the aluminum nitride layer 36. The aluminum nitride layer 36 is formed in a direction in which the ceramic main body 31 is eroded into the inside from the surface of the ceramic main body.

Here, in order to prevent the molten aluminum from becoming spherical in performing a heat treatment, the surface of the aluminum layer 41 is preferably pressed with a carbon plate or the like. In addition, in order to suppress heat generation or the like, the upper limit of the heat treatment temperature is preferably 750° C. or lower.

In the embodiment, as shown in FIG. 4, the whole aluminum layer 41 does not necessarily become the aluminum nitride layer 36 and part of the aluminum layer is present as a metal aluminum portion 38. Then, the aluminum nitride layer 36 is present between the metal aluminum portion 38 and the ceramic main body 31.

Here, in the case where the ceramic main body 31 is viewed from above, the area ratio of the aluminum nitride layer 36 is set to 80% or more with respect to the area in which the aluminum layer 41 is formed. In the embodiment, since the aluminum nitride layer 36 is present between the metal aluminum portion 38 and the ceramic main body 31, the area of the metal aluminum portion 38 and the area of the aluminum nitride layer 36 are assumed to be the same.

(Aluminum Plate Bonding Step S03)

Next, the aluminum plates 22 and 23 which become the circuit layer 12 and the metal layer 13 are bonded to the ceramic substrate through the aluminum nitride layer 36 of the ceramic substrate 30. Here, as a bonding method, a known method such as bonding using a brazing filler material, solid phase diffusion bonding, or transient liquid phase (TLP) bonding can be appropriately selected. In the embodiment, as shown in FIG. 6, bonding is performed using Al—Si-based brazing filler materials 26 and 27.

Specifically, the ceramic substrate 30 and the aluminum plates 22 and 23 are laminated with the Al—Si-based brazing filler materials 26 and 27 interposed therebetween, the laminate is put in a vacuum furnace in a state in which the laminate is pressurized in a range of 1 kgf/cm$^2$ or more and 10 kgf/cm$^2$ or less (0.098 MPa or more and 0.980 MPa or less) in the lamination direction, and the ceramic substrate 30 and the aluminum plates 22 and 23 are bonded to each other to form the circuit layer 12 and the metal layer 13.

As the bonding condition at this time, bonding is performed in an inert atmosphere such as argon or nitrogen, or in a vacuum atmosphere. In the case of a vacuum atmosphere, the vacuum condition may be set to be in a range of $10^{-6}$ Pa or more and $10^{-3}$ Pa or less. The heating temperature is set to be in a range of 580° C. or higher and 630° C. or lower and the retaining time at the heating temperature is set to be in a range of 10 minutes or longer and 45 minutes or shorter.

Here, the lower limit of the pressing load in the lamination direction is preferably 3 kgf/cm² or more and more preferably 5 kgf/cm² or more. On the other hand, the upper limit of the pressing load in the lamination direction is preferably 8 kgf/cm² or less and more preferably 7 kgf/cm² or less.

The lower limit of the heating temperature is preferably 585° C. or higher and more preferably 590° C. or higher. On the other hand, the upper limit of the heating temperature is preferably 625° C. or lower and more preferably 620° C. or lower.

Further, the lower limit of the retaining time at the heating temperature is preferably 15 minutes or longer and more preferably 20 minutes or longer. On the other hand, the upper limit of the retaining time at the heating temperature is 40 minutes or shorter and more preferably 30 minutes or shorter.

In addition, in the embodiment, since the metal aluminum portion 38 (aluminum nitride layer 36) is formed in 80% or more of the bonding surface with the aluminum plates 22 and 23 as described above, the metal aluminum portion 38 and the aluminum plates 22 and 23 are bonded to each other. Therefore, the ceramic substrate 30 and the aluminum plates 22 and 23 can be firmly bonded to each other even under a relatively low temperature condition.

Through the above-described steps, the insulating substrate 10 which is the embodiment is produced.

(Heat Sink Bonding Step S04)

Next, the heat sink 51 is bonded to the other surface of the metal layer 13 of the insulating substrate 10.

The insulating substrate 10 and the heat sink 51 are laminated through the brazing filler material and the laminate is put into a vacuum furnace while being pressurized in the lamination direction to perform brazing. Thus, the metal layer 13 of the insulating substrate 10 and the heat sink 51 are bonded to each other. At this time, as the brazing filler material, for example, an Al—Si-based brazing filler material foil having a thickness of 20 to 110 μm can be used and the brazing temperature is preferably set to be lower than the brazing temperature in the aluminum plate bonding step S03.

(LED Element Bonding Step S05)

Next, the LED element 3 is bonded to one surface of the circuit layer 12 of the insulating substrate 10 by soldering.

Through the above-described step, the LED module 1 shown in FIG. 1 is produced.

According to the insulating substrate 10 having such a configuration, since the ceramic substrate 30 has the ceramic main body 31 formed of silicon nitride and the aluminum nitride layer 36, and Al is present in a portion of the glass phase 33 of the ceramic main body 31 at an interface with the aluminum nitride layer 36, the ceramic main body 31 formed of silicon nitride and the aluminum nitride layer 36 are firmly bonded to each other. In addition, since the aluminum nitride layer 36 of the ceramic substrate 30 and the circuit layer 12 (aluminum plate 22) and the metal layer 13 (aluminum plate 23) are firmly bonded to each other, the bonding reliability between the ceramic substrate 30 and the circuit layer 12 and the metal layer 13 is high. Thus, it is possible to provide an insulating substrate 10 having excellent bonding reliability.

Further, in the embodiment, as shown in FIG. 3, the aluminum nitride layer 36 has the first aluminum nitride layer 36A having a nitrogen concentration of 50 atom % or more and 80 atom % or less and having a nitrogen concentration gradient in the thickness direction, and the second aluminum nitride layer 36B having a nitrogen concentration of 30 atom % or more and less than 50 atom % and having an almost constant nitrogen concentration in the thickness direction in order from the ceramic main body 31. Therefore, the aluminum nitride layer 36 is formed by a reaction of the silicon nitride of the ceramic main body 31 and the ceramic main body 31 formed of silicon nitride and the aluminum nitride layer 36 are firmly bonded to each other. Thus, even in the case where a thermal cycle is loaded on the insulating substrate 10, the bonding ratio between the ceramic substrate 30 and the circuit layer 12 and the metal layer 13 can be prevented from being decreased.

In addition, in the embodiment, in the ceramic substrate 30 before bonding, the metal aluminum portion 38 is formed on the surface of the aluminum nitride layer 36 to which the aluminum plates 22 and 23 are bonded, and the area ratio of the metal aluminum portion 38 on the bonding surface is set to 80% or more. Therefore, the aluminum portions of the aluminum plates 22 and 23 and the metal aluminum portion 38 are bonded to each other and even in the case where the bonding temperature is set to a relatively low temperature, the aluminum plates 22 and 23 and the ceramic substrate 30 can be firmly bonded to each other.

Further, the method for producing the insulating substrate 10 which is the embodiment includes the aluminum layer forming step S01 of forming the aluminum layer 41 having a thickness of 20 μm or less on the surface of the ceramic main body 31 formed of silicon nitride, and the aluminum nitride layer forming step S02 of heating the ceramic main body 31 on which the aluminum layer 41 is formed to a temperature equal to or higher than the solidus temperature of aluminum or an aluminum alloy constituting the aluminum layer 41 to form the aluminum nitride layer 36. Therefore, in the aluminum nitride layer forming step S02, Al penetrates into the glass phase 33 of the ceramic main body 31 and nitrogen (N) produced by decomposition of $Si_3N_4$ of the silicon nitride phase 32 is caused to react with aluminum (Al) of the aluminum layer 41 so that the aluminum nitride layer 36 can be formed.

Since the method includes the aluminum plate bonding step S03 of bonding the aluminum plates 22 and 23 to the ceramic main body through the aluminum nitride layer 36 (metal aluminum portion 38), the ceramic substrate 30 and the aluminum plates 22 and 23 can be easily bonded to each other.

Second Embodiment

Next, a second embodiment of the present invention will be described with reference to FIGS. 7 to 10. Members the same as those of the first embodiment will be denoted by the same reference numerals, and detailed descriptions thereof will be omitted.

The ceramic/aluminum bonded body according to the embodiment is an insulating substrate 110 formed by bonding a ceramic substrate 130 which is a ceramic member and an aluminum plate 122 (circuit layer 112) which is an aluminum member.

Figure 7:
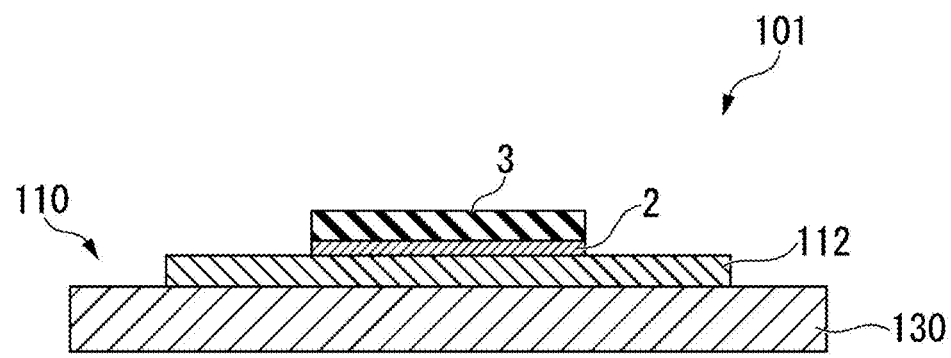
FIG. 7 is a cross-sectional view showing an LED module using a ceramic/aluminum bonded body (insulating substrate) which is a second embodiment of the present invention.

In FIG. 7, the insulating substrate 110 which is the second embodiment of the present invention and an LED module 101 using the insulating substrate 110 are shown.

The LED module 101 includes the insulating substrate 110, and an LED element 3 bonded to one surface of the insulating substrate 110 (upper side in FIG. 7) through a bonding layer 2.

As shown in FIG. 7, the insulating substrate 110 according to the embodiment includes the ceramic substrate 130 and the circuit layer 112 arranged on one surface of the ceramic substrate 130 (upper surface in FIG. 7).

The ceramic substrate 130 is constituted of highly insulating silicon nitride ($Si_3N_4$), and the thickness of the ceramic substrate is set to be in a range of 0.2 to 1.5 mm and is set to 0.32 mm in the embodiment.

Figure 8:
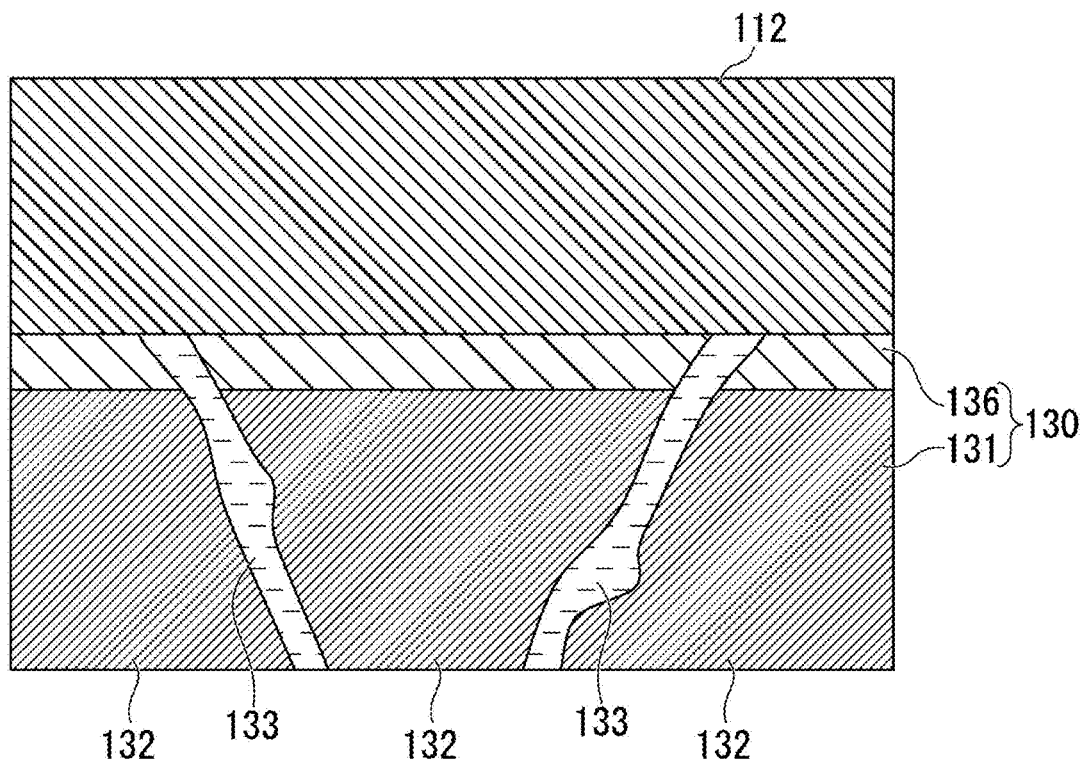
FIG. 8 is a schematic view of a bonding interface between a ceramic member (ceramic substrate) and an aluminum member (aluminum plate) of the ceramic/aluminum bonded body (insulating substrate) which is the second embodiment of the present invention.

Here, as shown in FIG. 8, the ceramic substrate 130 in the embodiment has a ceramic main body 131 formed of silicon nitride and an aluminum oxide layer 136 formed on the surface of the ceramic main body 131 to which the circuit layer 112 is bonded.

Figure 10:
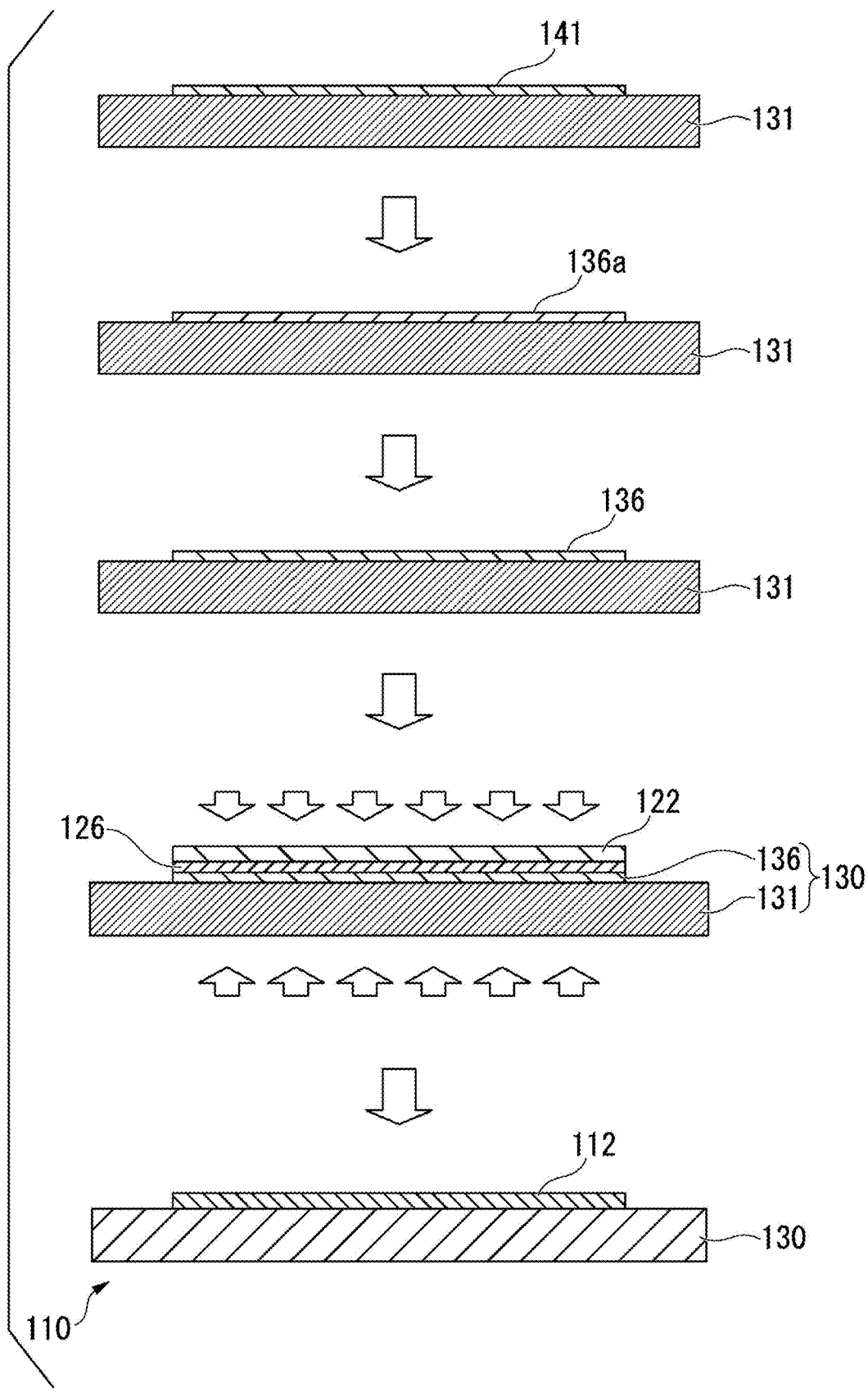
FIG. 10 is an explanatory diagram showing a method for producing the ceramic member (ceramic substrate) which is the second embodiment of the present invention.

As shown in FIG. 10, the circuit layer 112 is formed by bonding an aluminum plate 122 (aluminum member) formed of aluminum or an aluminum alloy to one surface of the ceramic substrate 130 (upper surface in FIG. 10). As the aluminum plate 122 (aluminum member) constituting the circuit layer 112, for example, a rolled plate of aluminum (2N aluminum) having a purity of 99% by mass or higher, aluminum having a purity of 99.9% by mass or higher, or aluminum having a purity of 99.99% by mass or higher is preferably used and in the embodiment, a rolled plate of aluminum (2N aluminum) having a purity of 99% by mass or higher is used. The thickness of the circuit layer 112 is set to be in a range of, for example, 0.05 mm or more and 0.8 mm or less and is set to 0.1 mm in the embodiment.

Here, an enlarged explanatory diagram of the bonding interface between the ceramic substrate 130 and the circuit layer 112 is shown in FIG. 8.

As described above, the ceramic substrate 130 has the ceramic main body 131 formed of silicon nitride and the aluminum oxide layer 136 formed on the surface of the ceramic main body 131 to which the circuit layer 112 is bonded and has a structure in which the aluminum oxide layer 136 and the circuit layer 112 are bonded to each other.

Here, the thickness of the aluminum oxide layer 136 is preferably set to be in a range of 4 nm or more and 100 nm or less.

As shown in FIG. 8, the ceramic main body 131 is provided with a silicon nitride phase 132 and a glass phase 133, and Al is present in the glass phase 133. The glass phase 133 is formed by a sintering aid used during the sintering of the raw material of silicon nitride and is present at the grain boundary between the silicon nitride phases 132 as shown in FIG. 8.

Here, in the embodiment, at the time of analyzing the bonding interface, a region in which, when the total value of Al, Si, O, and N is 100 atom %, Si is less than 15 atom %, and O is in a range of 3 atom % or more and 25 atom % or less is set to the glass phase 133.

The amount of Al present in the glass phase 133 is preferably set to in a range of 35 atom % or more and 65 atom % or less when the total value of Al, Si, O, and N is 100 atom %.

Figure 9:
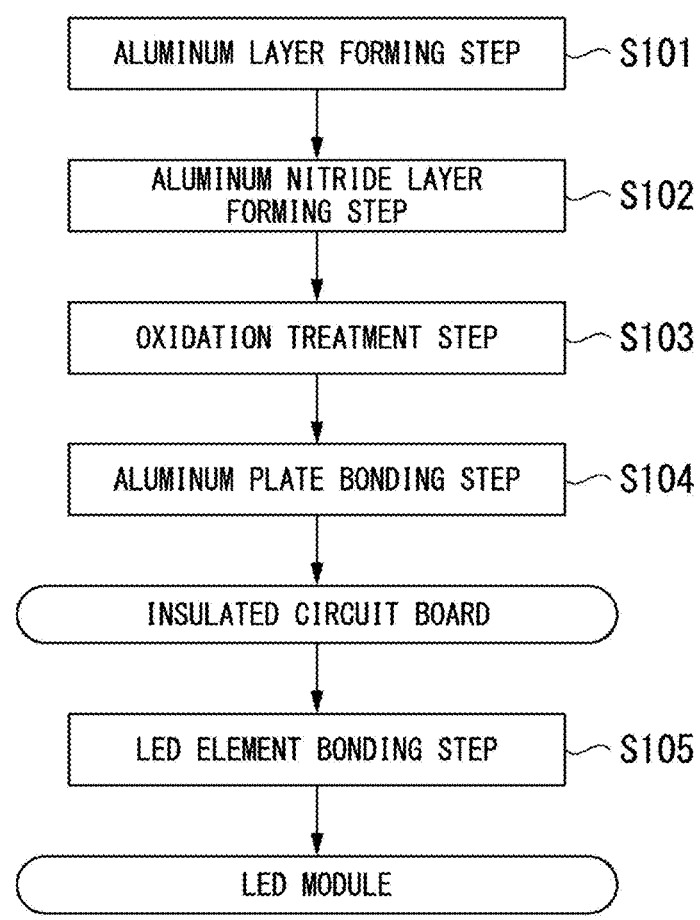
FIG. 9 is a flow chart showing a method for producing the ceramic/aluminum bonded body (insulating substrate) which is the second embodiment of the present invention.

Next, a method for producing the insulating substrate 110 which is the above-described embodiment will be described with reference to FIGS. 9 and 10.

(Aluminum Layer Forming Step S101)

A plate material (ceramic main body 131) formed of silicon nitride is prepared to form an aluminum layer 141 having a thickness of 20 μm or less and formed of aluminum or an aluminum alloy on the surface of the ceramic main body 131. In the embodiment, the aluminum layer 141 is constituted of pure aluminum having a purity of 99% by mass or higher.

(Aluminum Nitride Layer Forming Step S102)

Next, the ceramic main body 131 on which the aluminum layer 141 is formed is subjected to a heat treatment at a temperature equal to or higher than the solidus temperature of aluminum or an aluminum alloy constituting the aluminum layer 141 to form an aluminum nitride layer 136a.

Here, in order to prevent the molten aluminum from becoming spherical in performing a heat treatment, the surface of the aluminum layer 141 is preferably pressed with a carbon plate or the like. In addition, in order to suppress heat generation or the like, the upper limit of the heat treatment temperature is preferably 750° C. or lower.

The whole aluminum layer 141 does not necessarily become the aluminum nitride layer 136a and part of the aluminum layer 141 may be present as a metal aluminum portion.

(Oxidation Treatment Step S103)

Next, the ceramic main body 131 on which the aluminum nitride layer 136a is formed is put into an atmospheric furnace and is subjected to an oxidation treatment to form the aluminum oxide layer 136. At this time, the above-described metal aluminum portion is also oxidized and becomes part of the aluminum oxide layer 136.

In the oxidation treatment step S103, under the conditions of a treatment temperature in a range of 1100° C. or higher and 1300° C. or lower and a retaining time at the treatment temperature in a range of 1 minute or longer and 30 minutes or shorter in a dry air atmosphere having a dew point of −20° C. or lower, the aluminum nitride layer 136a is subjected to an oxidation treatment.

Here, the dew point in the atmosphere is preferably −30° C. or lower and more preferably −40° C. or lower.

In addition, the lower limit of the treatment temperature in the oxidation treatment step S103 is preferably 1130° C. or higher and more preferably 1180° C. or higher. On the other hand, the upper limit of the treatment temperature in the oxidation treatment step S103 is preferably 1250° C. or lower and more preferably 1200° C. or lower.

Further, the upper limit of the retaining time at the treatment temperature in the oxidation treatment step S103 is preferably 3 minutes or longer and more preferably 5 minutes or longer. On the other hand, the upper limit of the retaining time at the treatment temperature is preferably 20 minutes or shorter and more preferably 10 minutes or shorter.

In the oxidation treatment step S103, almost all of the aluminum nitride layer 136a becomes the aluminum oxide layer 136.

(Aluminum Plate Bonding Step S104)

Next, the aluminum plate 122 which becomes the circuit layer 112 is bonded to the ceramic substrate through the aluminum oxide layer 136 of the ceramic substrate 130. Here, as a bonding method, a known method such as bonding using a brazing filler material, solid phase diffusion bonding, or transient liquid phase (TLP) bonding can be appropriately selected. In the embodiment, as shown in FIG. 10, bonding is performed using an Al—Si-based brazing filler material 126.

Specifically, the ceramic substrate 130 and the aluminum plate 122 are laminated with the Al—Si-based brazing filler material 126 interposed therebetween, the laminate is put in a vacuum furnace in a state in which the laminate is pressurized in a range of 1 kgf/cm$^2$ or more and 10 kgf/cm$^2$ or less (0.098 MPa or more and 0.980 MPa or less) in the lamination direction, and the ceramic substrate 130 and the aluminum plate 122 are bonded to each other to form the circuit layer 112.

As the bonding conditions at this time, the vacuum condition is set to be in a range of 10$^{-6}$ Pa or more and 10$^{-3}$ Pa or less, the heating temperature is set to be in a range of 580° C. or higher and 630° C. or lower, and the retaining time at the heating temperature is set to be in a range of 10 minutes or longer and 45 minutes or shorter.

Through the above-described steps, the insulating substrate 110 which is the embodiment is produced.

(LED Element Bonding Step S105)

Next, the LED element 3 is bonded to one surface of the circuit layer 112 of the insulating substrate 110 by soldering.

Through the above-described step, the LED module 101 shown in FIG. 7 is produced.

According to the insulating substrate 110 having such a configuration and the LED module 101, since the ceramic substrate 130 has the ceramic main body 131 formed of silicon nitride and the aluminum oxide layer 136, and Al is present in the glass phase 133 of the ceramic main body 131 at the interface between the ceramic main body 131 and the aluminum oxide layer 136, the ceramic main body 131 formed of silicon nitride and the aluminum oxide layer 136 are firmly bonded to each other. In addition, since the aluminum oxide layer 136 of the ceramic substrate 130 and the circuit layer 112 (aluminum plate 122) are bonded to each other, the bonding reliability between the ceramic substrate 130 and the circuit layer 112 is high. Thus, it is possible to provide an insulating substrate 110 having excellent bonding reliability.

Further, the method for producing the insulating substrate 110 which is the embodiment includes the aluminum layer forming step S101 of forming the aluminum layer 141 having a thickness of 20 μm on the surface of the ceramic main body 131 formed of silicon nitride, the aluminum nitride layer forming step S102 of heating the ceramic main body 131 on which the aluminum layer 141 is formed to a temperature equal to or higher than the solidus temperature of aluminum or an aluminum alloy constituting the aluminum layer 141 to form the aluminum nitride layer 136a, and the oxidation treatment step S103 of subjecting the ceramic main body 131 on which the aluminum nitride layer 136a is formed to an oxidation treatment to form the aluminum oxide layer 136. Therefore, in the aluminum nitride layer forming step S102, the aluminum nitride layer 136a can be formed by allowing Al to penetrate into the glass phase 133 of the ceramic main body 131 and causing nitrogen (N) of the silicon nitride phase 132 to react with aluminum (Al) of the aluminum layer 141, and the aluminum oxide layer 136 can be formed by the oxidation treatment step S103.

Since the method includes the aluminum plate bonding step S104 of bonding the aluminum plate 122 to the ceramic substrate through aluminum oxide layer 136, the ceramic substrate 130 and the aluminum plate 122 can be easily bonded to each other.

Hereinabove, the embodiments of the present invention are described. However, the present invention is not limited thereto and can be appropriately modified without departing from the technical idea of the invention.

For example, in the embodiment, a description is made in which the LED module is formed by mounting the LED element on the insulating substrate, but the present invention is not limited thereto. For example, a power module may be formed by mounting a power semiconductor element on the circuit layer of the insulating substrate or a thermoelectric module may be formed by mounting a thermoelectric element on the circuit layer of the insulating substrate.

In addition, in the embodiment, a description is made in which the ceramic substrate and the aluminum plate are bonded using the brazing filler material, but the present invention is not limited thereto. The ceramic substrate and the aluminum plate may be bonded by solid phase diffusion bonding. Further, the ceramic substrate and the aluminum plate may be bonded by a transient liquid phase (TLP) bonding method in which additional elements such as Cu and Si are fixed to the bonding surface and melted and solidified by diffusing these additional elements. In addition, bonding may be performed when the bonding interface is in a semi-molten state.

Further, an example is described in which as the aluminum layer to be formed on the ceramic main body, a layer constituted of aluminum having a purity of 99% by mass or higher is used, but the present invention is not limited thereto. Other aluminum or aluminum alloys may be used. Here, in the case of using an aluminum alloy including Mg for the aluminum layer, Mg is present in the aluminum nitride layer and the aluminum oxide layer. Since Mg is an active element, a reaction between the silicon nitride and the aluminum layer is promoted, the aluminum nitride layer (and the aluminum oxide layer obtained by subjecting the aluminum nitride layer to an oxidation treatment) is formed with a sufficient thickness, and thus the ceramic main body and the aluminum nitride layer (aluminum oxide layer) are more firmly bonded to each other.

EXAMPLES

Hereinafter, verification tests conducted to confirm the effectiveness of the present invention will be described.

Example 1

A ceramic plate (40 mm×40 mm×0.32 mm t) formed of silicon nitride was prepared and an aluminum nitride layer and an aluminum oxide layer were formed on the ceramic plate by the method described in the above embodiment. In Examples 1 to 9, the aluminum nitride layer was formed under the conditions shown in Table 1. In Examples 11 and 12, the aluminum oxide layer was formed under the conditions shown in Table 2. In the example of the related art, the aluminum nitride layer and the aluminum oxide layer were not formed.

Then, the aluminum plate was bonded to the obtained ceramic substrate by each method shown in Tables 3 and 4 and an aluminum/ceramic bonded body (insulating substrate) was produced.

In "brazing" in Tables 3 and 4, an Al—Si-based brazing filler material (Si: 5% by mass, thickness: 7 μm) was used to perform bonding.

In "solid phase diffusion" in Tables 3 and 4, the aluminum plate and the ceramic substrate were bonded by solid phase diffusion bonding.

In "TLP" in Tables 3 and 4, Cu was fixed to on the bonding surface of the aluminum plate in an amount of 0.2 mg/cm$^2$, and bonding was performed by a transient liquid phase (TLP) bonding method.

The atmosphere in the aluminum plate bonding step in Tables 3 and 4 was set to a vacuum atmosphere of 2.0×10$^{-4}$ Pa.

Each aluminum/ceramic bonded body (insulating substrate) obtained as described above was evaluated as follows.

(Confirmation of Presence or Absence of Aluminum Nitride Layer, Aluminum Oxide Layer, and Al in Glass Phase)

After the aluminum nitride layer forming step S02 in Examples 1 to 9, and after the oxidation treatment step S103 in Examples 11 to 18, the cross section of the ceramic substrate was observed using a transmission electron microscope (Titan ChemiSTEM manufactured by FEI Company, an acceleration voltage of 200 kV) to confirm the presence or absence of the aluminum nitride layer, the presence or absence of the aluminum oxide layer, and the presence or absence of Al in the glass phase. In the example of the related art, the ceramic substrate before the aluminum plate was bonded was observed.

Figure 11:
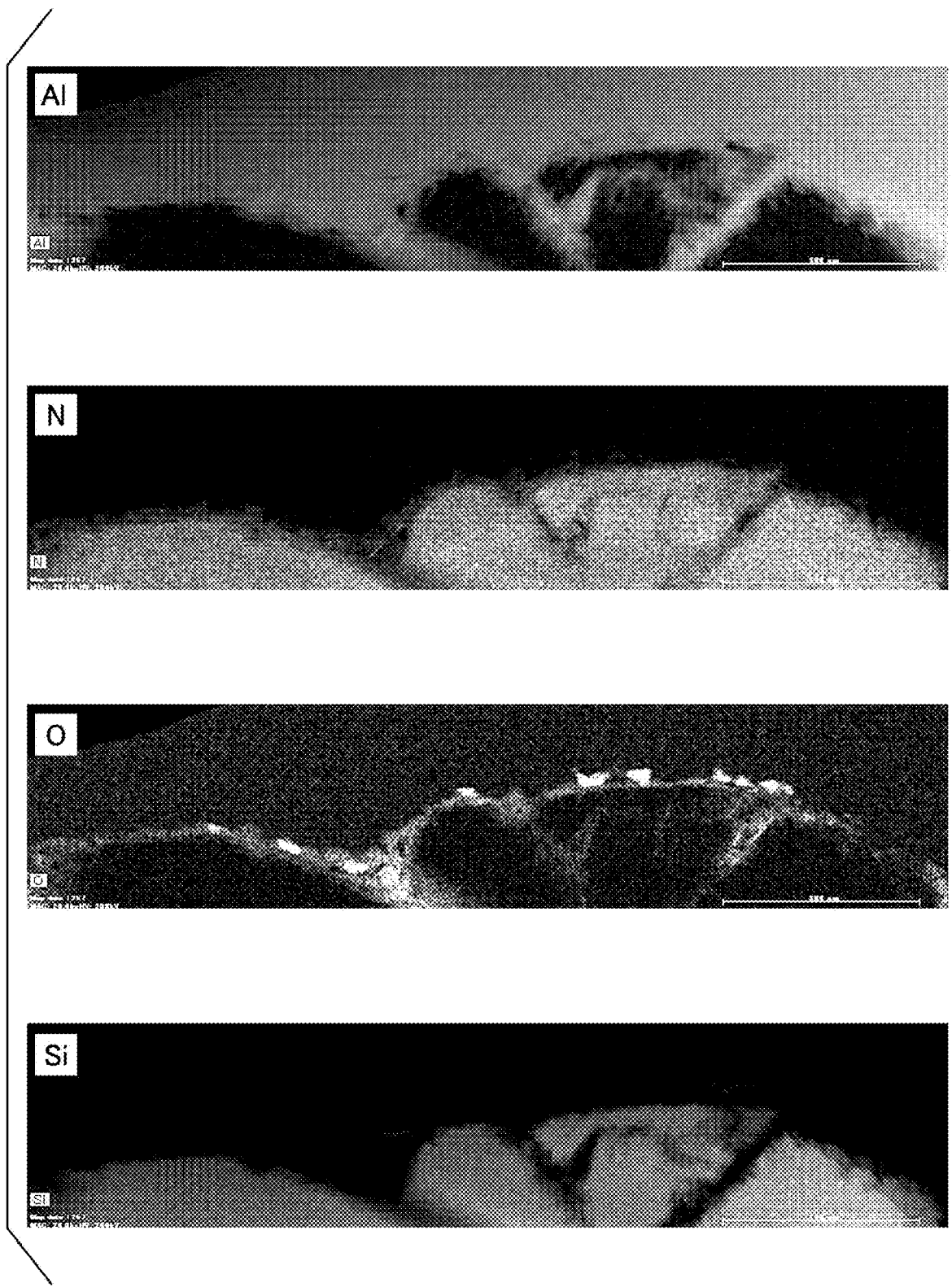
FIG. 11 is an element mapping diagram of a bonding interface between a ceramic member (ceramic substrate) and an aluminum member (aluminum plate) in a ceramic/aluminum bonded body (insulating substrate) in Example 1.

The glass phase was set to a region in which when the total value of Al, Si, O, and N is 100 atom %, Si is less than 15 atom % and O is in a range of 3 atom % or more and 25 atom % or less. The evaluation results are shown in Tables 1 and 2. In addition, the observation result of Example 1 is shown in FIG. 11.

(Area Ratio of Aluminum Nitride Layer)

For the area ratio of the aluminum nitride layer, after the aluminum nitride layer was formed (aluminum nitride layer forming step S02), the ceramic main body was observed from the above using EPMA (JXA-8539F, manufactured by JEOL Ltd.). Here, since the aluminum nitride layer was present between the metal aluminum portion and the ceramic main body, the area of the metal aluminum portion and the area of the aluminum nitride layer were considered to be the same, and (Area of metal aluminum portion/area of aluminum layer×100) was taken as the area ratio (%) of the aluminum nitride layer. The results are shown in Table 1.

(Thermal Cycle Test)

Using a thermal shock test machine (TSA-72ES, manufactured by ESPEC CORP.), a cycle at −40° C. for 5 minutes and at 175° C. for 5 minutes were performed 800 times on the insulating substrate in a gas phase.

After that, the bonding ratio between the ceramic substrate and the aluminum plate was evaluated as follows.

The evaluation of the bonding ratio was performed before the thermal cycle test (initial bonding ratio) and after the thermal cycle test (bonding ratio after thermal cycle).

In the evaluation of the bonding ratio, the bonding ratio of the interface between the ceramic substrate and the aluminum plate (circuit layer and metal layer) in the insulating substrate was evaluated using an ultrasonic flaw detector (FineSAT200, manufactured by Hitachi Power Solutions Co., Ltd.) and calculated using the following equation.

Here, the initial bonding area was an area to be bonded before bonding, that is, in this example, the initial bonding area was an area of the circuit layer and the metal layer (37 mm×37 mm).

(Bonding ratio)={(Initial Bonding Area)−(Peeling Area)}/(Initial Bonding Area)×100

In an image obtained by substituting an ultrasonic flaw image to binarization, the peeling was expressed as a white portion in the bonded portion and thus the area of the white portion was defined as a peeling area. The results are shown in Tables 3 and 4.

TABLE 1

| | Aluminum nitride layer formation condition | | | | | | |
|---|---|---|---|---|---|---|---|
| | Aluminum layer | | Retaining | Retaining | | | |
| | Material | Thickness (μm) | temperature (° C.) | time (min) | Presence or absence of aluminum nitride layer | Presence or absence of Al in glass phase | Area ratio (%) of aluminum nitride layer |
| Example 1 | 4N | 0.15 | 670 | 1 | Presence | Presence | 75.2 |
| Example 2 | 4N | 0.3 | 670 | 1 | Presence | Presence | 81.2 |
| Example 3 | 1050 | 5 | 730 | 10 | Presence | Presence | 88.3 |
| Example 4 | 1050 | 5 | 730 | 10 | Presence | Presence | 88.1 |
| Example 5 | 3003 | 10 | 730 | 10 | Presence | Presence | 94.8 |
| Example 6 | 5083 | 10 | 620 | 30 | Presence | Presence | 86.8 |
| Example 7 | 6061 | 10 | 680 | 15 | Presence | Presence | 91.4 |
| Example 8 | 6063 | 15 | 680 | 15 | Presence | Presence | 92.7 |
| Example 9 | AC7A | 20 | 620 | 30 | Presence | Presence | 90.5 |
| Example of related art | Aluminum nitride layer formation was not performed | | | | Absence | Absence | — |

TABLE 2

| | Aluminum nitride layer formation condition | | | Oxidation treatment condition | | | | |
|---|---|---|---|---|---|---|---|---|
| | Aluminum layer | | Retaining | Retaining | Dew | Retaining | Retaining | Presence or | Presence or |
| | Material | Thickness (μm) | temperature (° C.) | time (min) | point (° C.) | temperature (° C.) | time (min) | absence of aluminum oxide layer | absence of Al in glass phase |
| Example 11 | 4N | 0.2 | 670 | 1 | −40 | 1250 | 1 | Presence | Presence |
| Example 12 | 4N | 3 | 700 | 10 | −30 | 1100 | 30 | Presence | Presence |
| Example 13 | 4N | 3 | 700 | 5 | −20 | 1180 | 10 | Presence | Presence |
| Example 14 | 2024 | 3 | 560 | 5 | −30 | 1180 | 10 | Presence | Presence |
| Example 15 | 3003 | 8 | 750 | 10 | −40 | 1200 | 10 | Presence | Presence |
| Example 16 | 5052 | 20 | 660 | 30 | −40 | 1130 | 20 | Presence | Presence |
| Example 17 | AC4A | 8 | 620 | 20 | −40 | 1200 | 5 | Presence | Presence |

TABLE 2-continued

| | Aluminum nitride layer formation condition | | | Oxidation treatment condition | | | | |
|---|---|---|---|---|---|---|---|---|
| | Aluminum layer | | Retaining | Dew | Retaining | Retaining | Presence or | Presence or |
| | Material | Thickness (μm) | temperature (° C.) | Retaining time (min) | point (° C.) | temperature (° C.) | time (min) | absence of aluminum oxide layer | absence of Al in glass phase |
| Example 18 | AC4D | 16 | 600 | 30 | −40 | 1300 | 3 | Presence | Presence |
| Example of related art | Aluminum nitride layer formation and oxidation treatment were not performed | | | | | | | Absence | Absence |

TABLE 3

| | Aluminum plate | | Aluminum plate bonding step | | | | Bonding ratio (%) | |
|---|---|---|---|---|---|---|---|---|
| | Material | Thickness (μm) | Method | Bonding temperature (° C.) | Retaining time (min) | Applied pressure (MPa) | Before thermal cycle test | After thermal cycle test |
| Example 1 | 4N | 200 | Brazing | 630 | 10 | 0.49 | 97.3 | 84.1 |
| Example 2 | 4N | 200 | Brazing | 630 | 10 | 0.49 | 98.4 | 91.7 |
| Example 3 | 4N | 200 | Brazing | 620 | 30 | 0.098 | 95.8 | 92.3 |
| Example 4 | 4N | 200 | TLP | 590 | 45 | 0.98 | 98.8 | 91.7 |
| Example 5 | 3003 | 200 | TLP | 620 | 30 | 0.98 | 98.4 | 92.8 |
| Example 6 | 3003 | 200 | Brazing | 600 | 20 | 0.49 | 98.2 | 88.6 |
| Example 7 | 4N | 200 | Brazing | 600 | 20 | 0.49 | 96.5 | 90.6 |
| Example 8 | 1050 | 200 | Brazing | 600 | 20 | 0.686 | 95.3 | 88.7 |
| Example 9 | 1050 | 200 | Brazing | 600 | 20 | 0.686 | 98.0 | 88.1 |
| Example of related art | 4N | 200 | Brazing | 600 | 20 | 0.49 | 97.8 | 74.9 |

TABLE 4

| | Aluminum plate | | Aluminum plate bonding step | | | | Bonding ratio (%) | |
|---|---|---|---|---|---|---|---|---|
| | Material | Thickness (μm) | Method | Bonding temperature (° C.) | Retaining time (min) | Applied pressure (MPa) | Before thermal cycle test | After thermal cycle test |
| Example 11 | 4N | 150 | Solid phase diffusion | 630 | 20 | 0.98 | 96.8 | 92.7 |
| Example 12 | 4N | 150 | Solid phase diffusion | 630 | 30 | 0.784 | 99.0 | 92.8 |
| Example 13 | 3003 | 150 | TLP | 590 | 20 | 0.294 | 97.1 | 87.8 |
| Example 14 | 3003 | 150 | Solid phase diffusion | 630 | 40 | 0.98 | 97.6 | 93.0 |
| Example 15 | 1100 | 150 | TLP | 610 | 15 | 0.294 | 95.8 | 89.8 |
| Example 16 | 1100 | 150 | Brazing | 610 | 15 | 0.098 | 97.0 | 86.3 |
| Example 17 | 4N | 150 | Brazing | 610 | 15 | 0.294 | 98.1 | 90.2 |
| Example 18 | 4N | 150 | Brazing | 620 | 15 | 0.294 | 98.1 | 91.5 |
| Example of related art | 4N | 150 | Solid phase diffusion | 630 | 30 | 0.784 | 96.4 | 72.4 |

In the example of the related art in which the aluminum nitride layer or the aluminum oxide layer was not formed on the bonding surface of the ceramic plate formed of silicon nitride and the aluminum plate, the bonding ratio after the thermal cycle was remarkably decreased.

In contrast, in Examples 1 to 9 in which the aluminum nitride layer was formed on the bonding surface of the ceramic plate and the aluminum plate and Al was present in the glass phase of the ceramic plate and Examples 11 to 19 in which the aluminum oxide layer was formed on the bonding surface of the ceramic plate and the aluminum plate and Al was present in the glass phase of the ceramic plate, there was a little change in bonding ratio before and after the thermal cycle.

As shown in Examples 1 to 9 and 11 to 19, it was confirmed that regardless of the bonding method of the aluminum plate, in any bonding method of brazing, solid phase diffusion bonding, and TLP, the bonding reliability of the bonded body after the thermal cycle was improved.

Further, as shown in Examples 1 to 9 and 11 to 19, it was confirmed that regardless of the composition of the aluminum layer and the aluminum plate, in a case of using any of pure aluminum and various aluminum alloys, the bonding reliability of the bonded body after the thermal cycle was improved.

In addition, as shown in Tables 1 and 3, it was confirmed that as the area ratio of the aluminum nitride layer increased, the bonding reliability at the time of loading of the thermal cycle was improved.

Example 2

Next, a ceramic plate (40 mm×40 mm×0.32 mm t) formed of silicon nitride was prepared and an aluminum nitride layer was formed on the ceramic plate by the above method described in the embodiment. In Examples 21 to 24, the aluminum nitride layer was formed under the conditions shown in Table 5.

In Comparative Example, an aluminum nitride layer was formed on the surface of the ceramic plate by sputtering.

Then, an aluminum plate (thickness: 20 μm) having a purity of 99.99% by mass or higher (4N) was bonded to the obtained ceramic substrate using an Al—Si-based brazing filler material (Si: 5% by mass, thickness: 7 μm) under the conditions of a bonding temperature of 620° C., a retaining time of 30 min, and an applied pressure of 0.098 MPa, and thus an aluminum/ceramic bonded body (insulating substrate) was produced.

Regarding the aluminum/ceramic bonded body (insulating substrate) obtained as described above, the presence or absence of the aluminum nitride layer, the presence or absence of Al in the glass phase, the area ratio of the aluminum nitride layer, and the bonding ratio after the thermal cycle was loaded were evaluated as in Example 1. The evaluation results are shown in Table 5.

TABLE 5

| | Aluminum nitride layer formation condition | | | | Aluminum nitride layer | | | | Bonding ratio | |
|---|---|---|---|---|---|---|---|---|---|---|
| | Aluminum layer | | Retaining temperature (° C.) | Retaining time (min) | Presence or absence of first aluminum nitride layer | Presence or absence of second aluminum nitride layer | Presence or absence of Al in glass phase | Area ratio (%) of aluminum nitride layer | Before thermal cycle test (%) | After thermal cycle test (%) |
| | Material | Thickness (μm) | | | | | | | | |
| Example 21 | 1050 | 5 | 730 | 10 | Presence | Presence | Presence | 88.3 | 95.8 | 92.3 |
| Example 22 | 4N | 15 | 730 | 10 | Presence | Presence | Presence | 95.1 | 98.2 | 94.2 |
| Example 23 | 4N | 15 | 700 | 10 | Presence | Presence | Presence | 96.5 | 96.5 | 93.8 |
| Example 24 | 6061 | 10 | 700 | 10 | Presence | Presence | Presence | 91.4 | 97.9 | 93.7 |
| Comparative Example | Sputtering | | | | Absence | Presence | Absence | 100.0 | 99.1 | 48.6 |

In Comparative Example in which the aluminum nitride layer was formed on the surface of the ceramic plate formed of silicon nitride by sputtering, the first aluminum nitride layer having a nitrogen concentration of 50 atom % or more and 80 atom % or less and having a nitrogen concentration gradient in the thickness direction was not formed. In addition, Al was not confirmed in the glass phase of the ceramic main body. The bonding ratio after the thermal cycle was loaded was remarkably decreased.

In contrast, in Examples 21 to 24 in which the aluminum nitride layer had the first aluminum nitride layer having a nitrogen concentration of 50 atom % or more and 80 atom % or less and having a nitrogen concentration gradient in the thickness direction and the second aluminum nitride layer having a nitrogen concentration of 30 atom % or more and less than 50 atom %, there was a little change in bonding ratio before and after the thermal cycle.

From the above, according to Examples, it was confirmed that by forming the aluminum nitride layer or the aluminum oxide layer formed on the bonding surface of the ceramic member formed of silicon nitride ($Si_3N_4$), the ceramic/aluminum bonded body in which the ceramic member and the aluminum member are bonded with high reliability without melting of the aluminum member could be provided.

INDUSTRIAL APPLICABILITY

According to the present invention, it is possible to provide a ceramic/aluminum bonded body in which an aluminum member is bonded to a ceramic member formed of silicon nitride ($Si_3N_4$) with high reliability without melting.

REFERENCE SIGNS LIST

1, 101: LED module
10, 110: insulating substrate (ceramic/aluminum bonded body)
12, 112: circuit layer (aluminum plate, aluminum member)

13: metal layer (aluminum plate, aluminum member)
30, 130: ceramic substrate (ceramic member)
31, 131: ceramic main body
32, 132: silicon nitride phase
33, 133: glass phase
36: aluminum nitride layer
36A: first aluminum nitride layer
36B: second aluminum nitride layer
38: metal aluminum portion
136: aluminum oxide layer

The invention claimed is:

1. A ceramic/aluminum bonded body comprising:
a ceramic member; and
an aluminum member formed of aluminum or an aluminum alloy,
wherein the ceramic member and the aluminum member are bonded to each other,
the ceramic member has a ceramic main body formed of silicon nitride, and an aluminum nitride layer or an aluminum oxide layer formed on a surface of the ceramic main body to which the aluminum member is bonded, and the aluminum member is bonded to the ceramic member through the aluminum nitride layer or the aluminum oxide layer,
the ceramic main body includes a glass phase,
Al is present in a portion of the glass phase of the ceramic main body at an interface with the aluminum nitride layer or the aluminum oxide layer,
a thickness of the aluminum nitride layer or the aluminum oxide layer is 4 to 100 nm, and
an amount of Al present in the glass phase is in a range of 35 atom % or more and 65 atom % or less when a total value of Al, Si, O, and N is 100 atom %.

2. The ceramic/aluminum bonded body according to claim 1,
wherein the aluminum nitride layer is formed on the surface of the ceramic main body to which the aluminum member is bonded, and the aluminum nitride layer has a first aluminum nitride layer having a nitrogen concentration of 50 atom % or more and 80 atom % or less and having a nitrogen concentration gradient in a thickness direction, and a second aluminum nitride layer having a nitrogen concentration of 30 atom % or more and less than 50 atom % in order from the ceramic main body.

3. An insulating substrate comprising:
a ceramic substrate; and
an aluminum plate formed of aluminum or an aluminum alloy,
wherein the ceramic substrate and the aluminum plate are bonded to each other,
the ceramic substrate has a ceramic main body formed of silicon nitride and an aluminum nitride layer or an aluminum oxide layer formed on a surface of the ceramic main body to which the aluminum plate is bonded, and the aluminum plate is bonded to the ceramic substrate through the aluminum nitride layer or the aluminum oxide layer,
the ceramic main body includes a glass phase,
Al is present in a portion of the glass phase of the ceramic main body at an interface with the aluminum nitride layer or the aluminum oxide layer,
a thickness of the aluminum nitride layer or the aluminum oxide layer is 4 to 100 nm, and
an amount of Al present in the glass phase is in a range of 35 atom % or more and 65 atom % or less when a total value of Al, Si, O, and N is 100 atom %.

4. The insulating substrate according to claim 3,
wherein the aluminum nitride layer is formed on the surface of the ceramic main body to which the aluminum plate is bonded, and the aluminum nitride layer has a first aluminum nitride layer having a nitrogen concentration of 50 atom % or more and 80 atom % or less and having a nitrogen concentration gradient in a thickness direction, and a second aluminum nitride layer having a nitrogen concentration of 30 atom % or more and less than 50 atom % in order from the ceramic main body.

5. An LED module comprising:
the insulating substrate according to claim 3; and
an LED element bonded to a surface of the aluminum plate opposite to the ceramic substrate.

6. A ceramic member comprising:
a ceramic main body formed of silicon nitride; and
an aluminum nitride layer or an aluminum oxide layer formed on a surface of the ceramic main body,
wherein the ceramic main body includes a glass phase,
Al is present in a portion of the glass phase of the ceramic main body at an interface with the aluminum nitride layer or the aluminum oxide layer,
a thickness of the aluminum nitride layer or the aluminum oxide layer is 4 to 100 nm, and
an amount of Al present in the glass phase is in a range of 35 atom % or more and 65 atom % or less when a total value of Al, Si, O, and N is 100 atom %.

7. The ceramic member according to claim 6,
wherein the aluminum nitride layer is formed on a surface of the ceramic main body, and the aluminum nitride layer has a first aluminum nitride layer having a nitrogen concentration of 50 atom % or more and 80 atom % or less and having a nitrogen concentration gradient in a thickness direction, and a second aluminum nitride layer having a nitrogen concentration of 30 atom % or more and less than 50 atom % in order from the ceramic main body.

8. The ceramic member according to claim 6,
wherein the aluminum nitride layer is formed on the surface of the ceramic main body, and a metal aluminum portion is formed on a surface of the aluminum nitride layer opposite to the ceramic main body.

9. A method for producing a ceramic/aluminum bonded body to produce the ceramic/aluminum bonded body according to claim 1, the method comprising:
an aluminum layer forming step of forming an aluminum layer having a thickness of 20 μm or less on a surface of a ceramic main body formed of silicon nitride;
an aluminum nitride layer forming step of heating the ceramic main body on which the aluminum layer is formed to a temperature equal to or higher than a solidus temperature of the aluminum layer to form an aluminum nitride layer; and
an aluminum member bonding step of bonding an aluminum member to the ceramic main body through the aluminum nitride layer.

10. The method for producing a ceramic/aluminum bonded body according to claim 9, further comprising:
an oxidation treatment step of oxidizing the aluminum nitride layer to form an aluminum oxide layer; and
an aluminum member bonding step of bonding an aluminum member to the ceramic main body through the aluminum oxide layer.

11. A method for producing an insulating substrate to produce the insulating substrate according to claim 3, the method comprising:

an aluminum layer forming step of forming an aluminum layer having a thickness of 20 μm or less on a surface of a ceramic main body formed of silicon nitride;

an aluminum nitride layer forming step of heating the ceramic main body on which the aluminum layer is formed to a temperature equal to or higher than a solidus temperature of the aluminum layer to form an aluminum nitride layer; and an aluminum plate bonding step of bonding an aluminum plate to the ceramic main body through the aluminum nitride layer.

12. The method for producing an insulating substrate according to claim 11, further comprising:

an oxidation treatment step of oxidizing the aluminum nitride layer to form an aluminum oxide layer; and an aluminum plate bonding step of bonding an aluminum plate to the ceramic main body through the aluminum oxide layer.

13. An LED module comprising:

the insulating substrate according to claim 4; and an LED element bonded to a surface of the aluminum plate opposite to the ceramic substrate.

14. The ceramic member according to claim 7, wherein the aluminum nitride layer is formed on the surface of the ceramic main body, and a metal aluminum portion is formed on a surface of the aluminum nitride layer opposite to the ceramic main body.

15. A method for producing a ceramic/aluminum bonded body to produce the ceramic/aluminum bonded body according to claim 2, the method comprising:

an aluminum layer forming step of forming an aluminum layer having a thickness of 20 μm or less on a surface of a ceramic main body formed of silicon nitride;

an aluminum nitride layer forming step of heating the ceramic main body on which the aluminum layer is formed to a temperature equal to or higher than a solidus temperature of the aluminum layer to form an aluminum nitride layer; and an aluminum member bonding step of bonding an aluminum member to the ceramic main body through the aluminum nitride layer.

16. The method for producing a ceramic/aluminum bonded body according to claim 15, further comprising:

an oxidation treatment step of oxidizing the aluminum nitride layer to form an aluminum oxide layer; and an aluminum member bonding step of bonding an aluminum member to the ceramic main body through the aluminum oxide layer.

17. A method for producing an insulating substrate to produce the insulating substrate according to claim 4, the method comprising:

an aluminum layer forming step of forming an aluminum layer having a thickness of 20 μm or less on a surface of a ceramic main body formed of silicon nitride;

an aluminum nitride layer forming step of heating the ceramic main body on which the aluminum layer is formed to a temperature equal to or higher than a solidus temperature of the aluminum layer to form an aluminum nitride layer; and an aluminum plate bonding step of bonding an aluminum plate to the ceramic main body through the aluminum nitride layer.

18. The method for producing an insulating substrate according to claim 16, further comprising:

an oxidation treatment step of oxidizing the aluminum nitride layer to form an aluminum oxide layer; and an aluminum plate bonding step of bonding an aluminum plate to the ceramic main body through the aluminum oxide layer.

19. The ceramic/aluminum bonded body according to claim 1, wherein the aluminum nitride layer, when present, is formed by a reaction of an aluminum layer with the ceramic main body, and the aluminum oxide layer, when present, is formed by subjecting the aluminum nitride layer to an oxidation treatment.

20. The ceramic/aluminum bonded body according to claim 1, wherein the glass phase is also present in the aluminum nitride layer or the aluminum oxide layer.

* * * * *